US00RE43189E

(19) United States
(12) Reissued Patent
Liljeryd et al.

(10) Patent Number: US RE43,189 E
(45) Date of Reissued Patent: Feb. 14, 2012

(54) ENHANCING PERCEPTUAL PERFORMANCE OF SBR AND RELATED HFR CODING METHODS BY ADAPTIVE NOISE-FLOOR ADDITION AND NOISE SUBSTITUTION LIMITING

(75) Inventors: Lars G. Liljeryd, Solna (SE); Kristofer Kjoerling, Solna (SE); Per Ekstrand, Stockholm (SE); Frederik Henn, Bromma (SE)

(73) Assignee: Dolby International AB, Amsterdam Zuid-Oost (NL)

(21) Appl. No.: 11/371,309

(22) Filed: Mar. 9, 2006

Related U.S. Patent Documents

Reissue of:
(64) Patent No.: 6,708,145
Issued: Mar. 16, 2004
Appl. No.: 09/647,057
PCT Filed: Jan. 26, 2000
PCT No.: PCT/SE00/00159
§ 371 (c)(1),
(2), (4) Date: Dec. 20, 2000
PCT Pub. No.: WO00/45379
PCT Pub. Date: Aug. 3, 2000

(30) Foreign Application Priority Data

Jan. 27, 1999 (SE) ..... 9900256-0
Oct. 1, 1999 (SE) ..... 9903553-7

(51) Int. Cl.
*G10L 19/00* (2006.01)
*G10L 19/14* (2006.01)

(52) U.S. Cl. ..... 704/200.1; 704/225; 704/501

(58) Field of Classification Search ..... 704/200.1, 704/225, 501, 502
See application file for complete search history.

(56) References Cited

U.S. PATENT DOCUMENTS

| | | | | | |
|---|---|---|---|---|---|
| 4,538,297 | A | * | 8/1985 | Waller, Jr. | 381/106 |
| 4,667,340 | A | * | 5/1987 | Arjmand et al. | 704/207 |
| 5,127,054 | A | * | 6/1992 | Hong et al. | 704/266 |
| 5,226,000 | A | * | 7/1993 | Moses et al. | 708/313 |
| 5,664,055 | A | * | 9/1997 | Kroon | 704/223 |
| 5,734,755 | A | * | 3/1998 | Ramchandran et al. | 382/250 |
| 5,774,842 | A | * | 6/1998 | Nishio et al. | 704/226 |
| 5,956,674 | A | * | 9/1999 | Smyth et al. | 704/200.1 |
| 5,974,380 | A | * | 10/1999 | Smyth et al. | 704/229 |
| 5,974,387 | A | | 10/1999 | Kageyama et al. | |
| 5,983,172 | A | | 11/1999 | Takashima et al. | |
| 5,990,738 | A | * | 11/1999 | Wright et al. | 330/149 |
| 6,226,616 | B1 | * | 5/2001 | You et al. | 704/500 |

(Continued)

FOREIGN PATENT DOCUMENTS

EP 0706299 A 4/1996

(Continued)

OTHER PUBLICATIONS

Enbom, et al., Bandwidth Expansion of Speech Based on Vector Quantization of the Mel Frequency Cepstral Coefficients, Jun. 20, 1999, IEEE Workshop on Speech Coding Proceedings.

(Continued)

*Primary Examiner* — Angela A Armstrong
(74) *Attorney, Agent, or Firm* — Michael A. Glenn; Glenn Patent Group

(57) ABSTRACT

Methods and an apparatus for enhancement of source coding systems utilizing high frequency reconstruction (HFR) are introduced. The problem of insufficient noise contents is addressed in a reconstructed highband, by using Adaptive Noise-floor Addition. New methods are also introduced for enhanced performance by means of limiting unwanted noise, interpolation and smoothing of envelope adjustment amplification factors. The methods and apparatus used are applicable to both speech coding and natural audio coding systems.

22 Claims, 5 Drawing Sheets

U.S. PATENT DOCUMENTS

| | | | | |
|---|---|---|---|---|
| 6,324,505 | B1 * | 11/2001 | Choy et al. | 704/230 |
| 6,385,573 | B1 * | 5/2002 | Gao et al. | 704/220 |
| 6,449,596 | B1 * | 9/2002 | Ejima | 704/501 |
| 6,708,145 | B1 | 3/2004 | Liljeryd et al. | |
| 6,826,526 | B1 | 11/2004 | Norimatsu et al. | |

FOREIGN PATENT DOCUMENTS

| | | | |
|---|---|---|---|
| EP | A1-0756267 | * | 1/1997 |
| EP | A2-0843301 | * | 5/1998 |
| JP | 55-102982 | * | 8/1980 |
| JP | A 07-500683 | | 1/1995 |
| JP | A 08-123495 | | 5/1996 |
| JP | A 08-305396 | | 11/1996 |
| JP | 09046233 A | | 2/1997 |
| JP | A 09-101798 | | 4/1997 |
| JP | A 09-214346 | | 8/1997 |
| JP | A 10-276095 | | 10/1998 |
| WO | A2-9857436 | * | 12/1998 |
| WO | WO 98/57436 | | 12/1998 |
| WO | WO 98/57436 A2 | | 12/1998 |
| WO | A1-9936906 | * | 7/1999 |
| WO | WO 02/052545 A1 | * | 7/2002 |

OTHER PUBLICATIONS

Schulz, D. Improving Audio Codecs by Noise Substitution. Journal of the Audio Engineering Society. Audio Engineering Society. New York, NY. vol. 44. No. 7/8. Jul. 1996.

Hemami et al. ("Subband-Coded Image Reconstruction For Lossy Packet Networks", IEEE Transactions on Image Processing, Apr. 1997).*

Xiang et al. ("Optimum Bit Allocation And Decomposition For High Quality Audio Coding", IEEE International Conference on Acoustics, Speech, and Signal Processing, Apr. 1997).*

Donald Schulz, "Improving Audio Codecs By Noise Substitution J. Audio Eng. Soc.," vol. 44, No. 7/8, (Jul. 1996).*

* cited by examiner

ENHANCING PERCEPTUAL PERFORMANCE OF SBR AND RELATED HFR CODING METHODS BY ADAPTIVE NOISE-FLOOR ADDITION AND NOISE SUBSTITUTION LIMITING

Matter enclosed in heavy brackets [ ] appears in the original patent but forms no part of this reissue specification; matter printed in italics indicates the additions made by reissue.

*CROSS-REFERENCE TO RELATED APPLICATIONS*

*This application is a Reissue of U.S. patent application Ser. No. 09/647,057 filed 20 Dec. 2000 (U.S. Pat. No. 6,708,145), which is a National Phase entry of PCT Patent Application Serial No. PCT/SE00/00159 filed 26 Jan. 2000. The reissue divisional U.S. patent application Ser. No. 12/491,001, filed on Jun. 24, 2009 claims the benefit of this application. The reissue divisional U.S. patent application Ser. No. 12/490,969, filed on Jun. 24, 2009 claims the benefit of this application. The reissue divisional U.S. patent application Ser. No. 12/490,990, filed on Jun. 24, 2009 claims the benefit of this application.*

This application is the national phase under 35 U.S.C. §371 of PCT International Application No. PCT/SE00/00159 which has an International filing date of Jan. 26, 2000, which designated the United States of America.

TECHNICAL FIELD

The present invention relates to source coding systems utilising high frequency reconstruction (HFR) such as Spectral Band Replication, SBR [WO 98/57436] or related methods. It improves performance of both high quality methods (SBR), as well as low quality copy-up methods [U.S. Pat. No. 5,127,054]. It is applicable to both speech coding and natural audio coding systems. Furthermore, the invention can beneficially be used with natural audio codecs with- or without high-frequency reconstruction, to reduce the audible effect of frequency bands shut-down usually occurring under low bitrate conditions, by applying Adaptive Noise-floor Addition.

BACKGROUND OF THE INVENTION

The presence of stochastic signal components is an important property of many musical instruments, as well as the human voice. Reproduction of these noise components, which usually are mixed with other signal components, is crucial if the signal is to be perceived as natural sounding. In high-frequency reconstruction it is, under certain conditions, imperative to add noise to the reconstructed high-band in order to achieve noise contents similar to the original. This necessity originates from the fact that most harmonic sounds, from for instance reed or bow instruments, have a higher relative noise level in the high frequency region compared to the low frequency region. Furthermore, harmonic sounds sometimes occur together with a high frequency noise resulting in a signal with no similarity between noise levels of the highband and the low band. In either case, a frequency transposition, i.e. high quality SBR, as well as any low quality copy-up-process will occasionally suffer from lack of noise in the replicated highband. Even further, a high frequency reconstruction process usually comprises some sort of envelope adjustment, where it is desirable to avoid unwanted noise substitution for harmonics. It is thus essential to be able to add and control noise levels in the high frequency regeneration process at the decoder.

Under low bitrate conditions natural audio codecs commonly display severe shut down of frequency bands. This is performed on a frame to frame basis resulting in spectral holes that can appear in an arbitrary fashion over the entire coded frequency range. This can cause audible artifacts. The effect of this can be alleviated by Adaptive Noise-floor Addition.

Some prior art audio coding systems include means to recreate noise components at the decoder. This permits the encoder to omit noise components in the coding process, thus making it more efficient. However, for such methods to be successful, the noise excluded in the encoding process by the encoder must not contain other signal components. This hard decision based noise coding scheme results in a relatively low duty cycle since most noise components are usually mixed, in time and/or frequency, with other signal components. Furthermore it does not by any means solve the problem of insufficient noise contents in reconstructed high frequency bands.

SUMMARY OF THE INVENTION

The present invention addresses the problem of insufficient noise contents in a regenerated highband, and spectral holes due to frequency bands shut-down under low-bitrate conditions, by adaptively adding a noise-floor. It also prevents unwanted noise substitution for harmonics. This is performed by means of a noise-floor level estimation in the encoder, and adaptive noise-floor addition and unwanted noise substitution limiting at the decoder.

The adaptive Noise-floor Addition and the Noise Substitution Limiting method comprise the following steps:

- At an encoder, estimating the noise-floor level of an original signal, using dip- and peak-followers applied to a spectral representation of the original signal;
- At an encoder mapping the noise-floor level to several frequency bands, or representing it using Linear Predictive Coding (LPC) or any other polynomial representation;
- At an encoder or decoder, smoothing the noise-floor level in time and/or frequency;
- At a decoder, shaping random noise in accordance to a spectral envelope representation of the original signal, and adjusting the noise in accordance to the noise-floor level estimated in the encoder;
- At a decoder, smoothing the noise level in time and/or frequency;
- Adding the noise-floor to the high-frequency reconstructed signal, either in the regenerated high-band, or in the shut-down bands.
- At a decoder, adjusting the spectral envelope of the high-frequency reconstructed signal using limiting of the envelope adjustment amplification factors.
- At a decoder, using interpolation of the received spectral envelope, for increased frequency resolution, and thus improved performance of the limiter.
- At a decoder, applying smoothing to the envelope adjustment amplification factors.
- At a decoder generating a high-frequency reconstructed signal which is the sum of several high-frequency reconstructed signals, originating from different lowband frequency ranges, and analyzing the lowband to provide control data to the summation.

BRIEF DESCRIPTION OF THE DRAWINGS

The present invention will now be described by way of illustrative examples, not limiting the scope or spirit of the invention, with reference to the accompanying drawings, in which.

DESCRIPTION OF PREFERRED EMBODIMENTS

The below-described embodiments are merely illustrative for the principles of the present invention for improvement of high frequency reconstruction systems. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

Noise-floor Level Estimation

Figure 1:
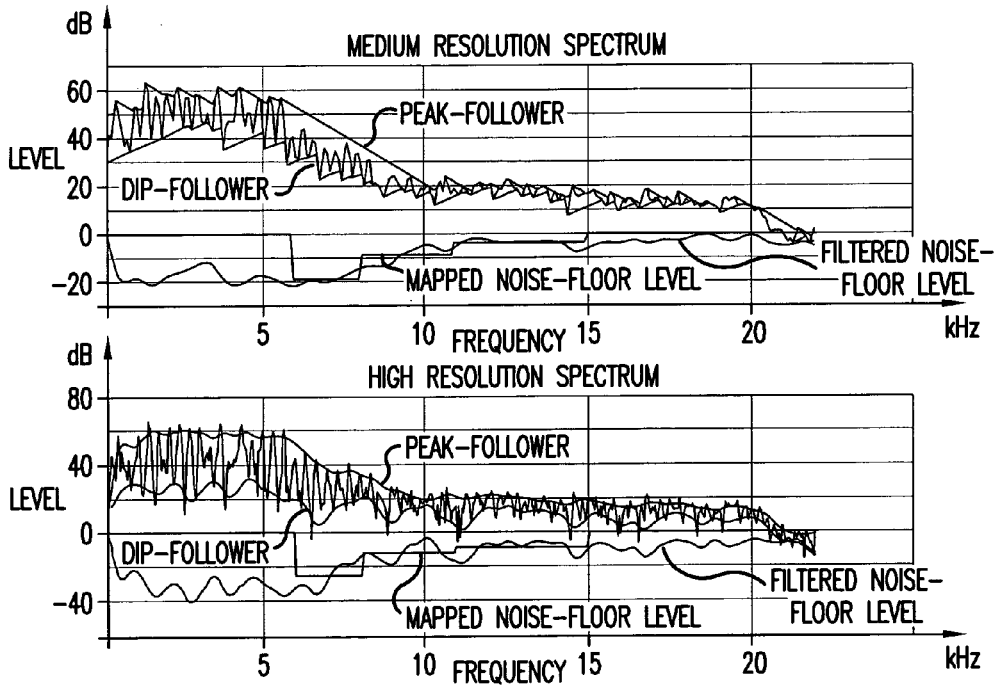
FIG. 1 illustrates the peak- and dip-follower applied to a high- and medium-resolution spectrum, and the mapping of the noise-floor to frequency bands, according to the present invention.

When analysing an audio signal spectrum with sufficient frequency resolution, formants, single sinusodials etc. are clearly visible, this is hereinafter referred to as the fine structured spectral envelope. However, if a low resolution is used, no fine details can be observed, this is hereinafter referred to as the coarse structured spectral envelope. The level of the noise-floor, albeit it is not necessarily noise by definition, as used throughout the present invention, refers to the ratio between a coarse structured spectral envelope interpolated along the local minimum points in the high resolution spectrum, and a coarse structured spectral envelope interpolated along the local maximum points in the high resolution spectrum. This measurement is obtained by computing a high resolution FFT for the signal segment, and applying a peak- and dip-follower, FIG. 1. The noise-floor level is then computed as the difference between the peak- and the dip-follower. With appropriate smoothing of this signal in time and frequency, a noise-floor level measure is obtained. The peak follower function and the dip follower function can be described according to eq. 1 and eq. 2, $$y_{peak}(X(k)) = \max(Y(X(k-1)) - T, X(k)) \forall\ 1 \le k \le \frac{\text{fftSize}}{2} \qquad \text{eq. 1}$$

$$y_{dip}(X(k)) = \min(Y(X(k-1)) + T, X(k)) \forall\ 1 \le k \le \frac{\text{fftSize}}{2} \qquad \text{eq. 2}$$

where T is the decay factor, and X(k) is the logarithmic absolute value of the spectrum at line k. The pair is calculated for two different FET sizes, one high resolution and one medium resolution, in order to get a good estimate during vibratos and quasi-stationary sounds. The peak- and dip-followers applied to the high resolution FFT are LP-filtered in order to discard extreme values. After obtaining the two noise-floor level estimates, the largest is chosen. In one implementation of the present invention the noise-floor level values are mapped to multiple frequency bands, however, other mappings could also be used e.g. curve fitting polynomials or LPC coefficients. It should be pointed out that several different approaches could be used when determining the noise contents in an audio signal. However it is, as described above, one objective of this invention, to estimate the difference between local minima and maxima in a high-resolution spectrum, albeit this is not necessarily an accurate measurement of the true noise-level. Other possible methods are linear prediction, autocorrelation etc, these are commonly used in hard decision noise/no noise algorithms ["Improving Audio Codecs by Noise Substitution" D. Schultz, JAES, Vol. 44, No. 7/8, 1996]. Although these methods strive to measure the amount of true noise in a signal, they are applicable for measuring a noise-floor-level as defined in the present invention, albeit not giving equally good results as the method outlined above. It is also possible to use an analysis by synthesis approach, i.e. having a decoder in the encoder and in this manner assessing a correct value of the amount of adaptive noise required.

Adaptive Noise-floor Addition

In order to apply the adaptive noise-floor, a spectral envelope representation of the signal must be available. This can be linear PCM values for filterbank implementations or an LPC representation. The noise-floor is shaped according to this envelope prior to adjusting it to correct levels, according to the values received by the decoder. It is also possible to adjust the levels with an additional offset given in the decoder.

Figure 2:
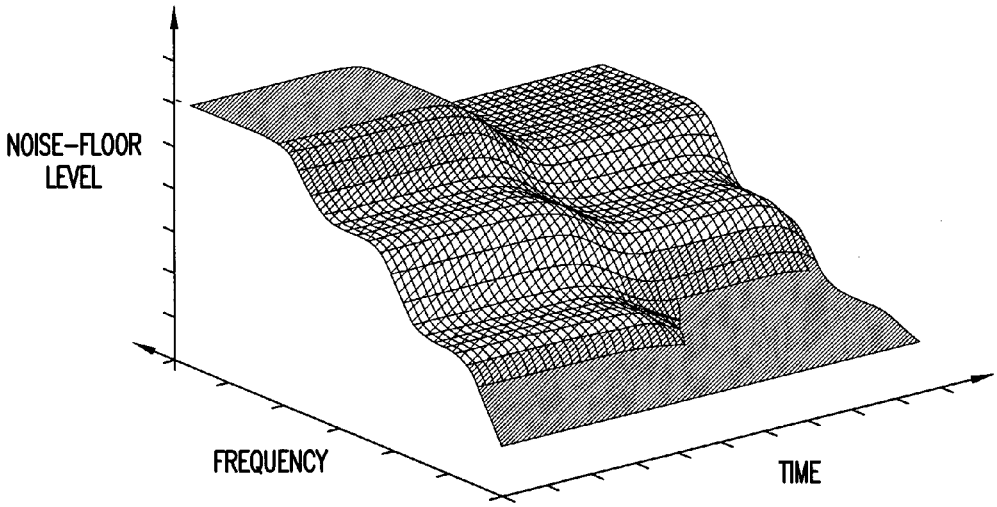
FIG. 2 illustrates the noise-floor with smoothing in time and frequency, according to the present invention.
Figure 3:
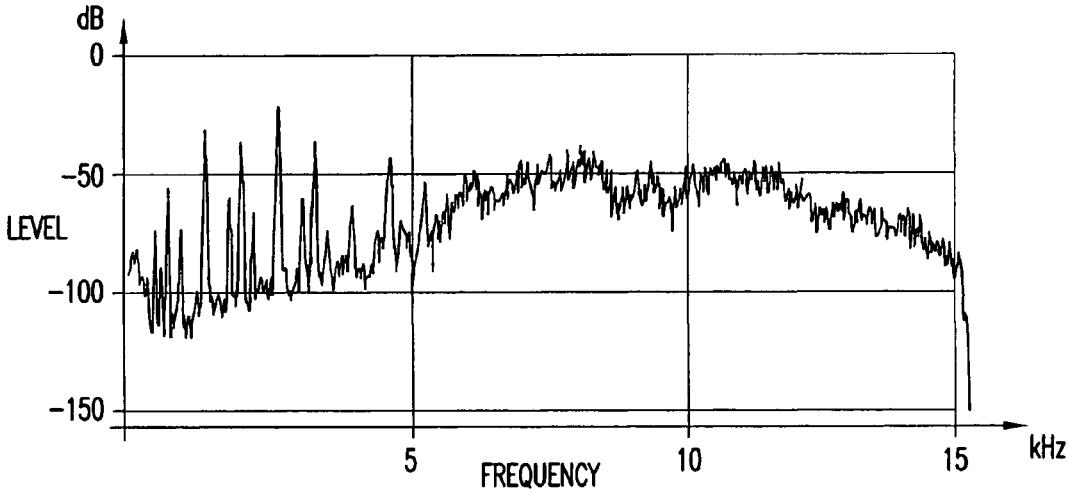
FIG. 3 illustrates the spectrum of an original input signal.
Figure 4:
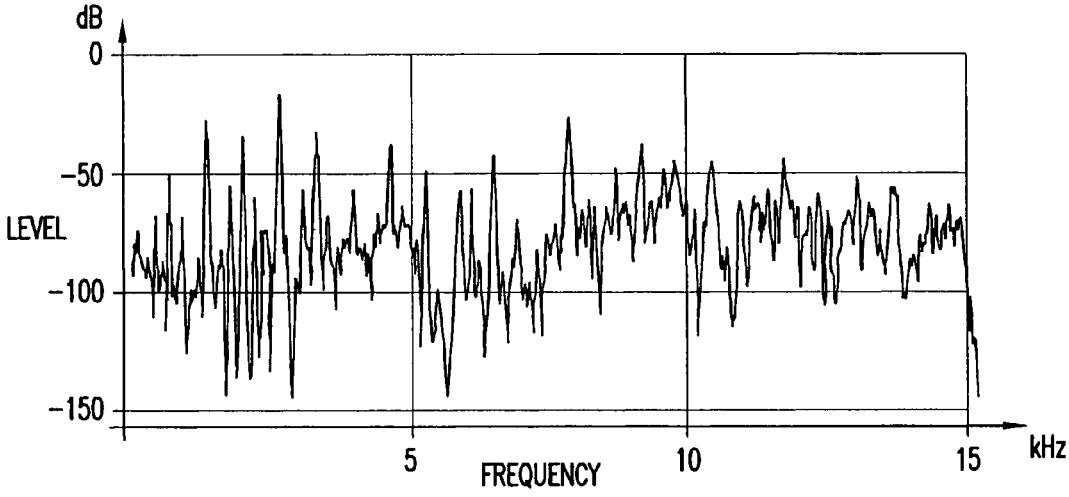
FIG. 4 illustrates the spectrum of the output signal from a SBR process without Adaptive Noise-floor Addition.
Figure 5:
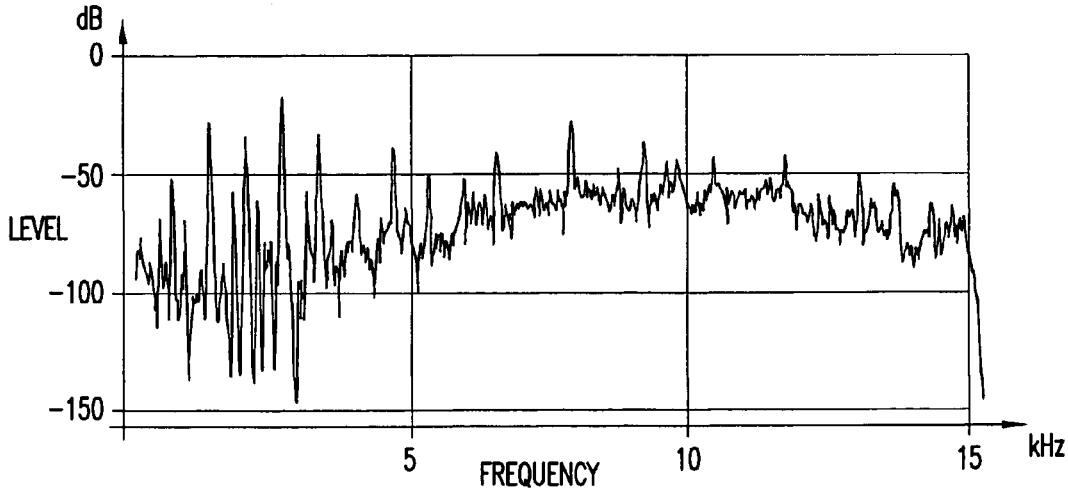
FIG. 5 illustrates the spectrum of the output signal with SBR and Adaptive Noise-floor Addition, according to the present invention.

In one decoder implementation of the present invention, the received noise-floor levels are compared to an upper limit given in the decoder, mapped to several filterbank channels and subsequently smoothed by LP filtering in both time and frequency, FIG. 2. The replicated highband signal is adjusted in order to obtain the correct total signal level after adding the noise-floor to the signal. The adjustment factors and noise-floor energies are calculated according to eq. 3 and eq. 4.

$$\text{noiseLevel}(k, l) = \text{sfb_nrg}(k, l) \cdot \frac{\text{nf}(k, l)}{1 + \text{nf}(k, l)} \qquad \text{eq. 3}$$

$$\text{adjustFactor}(k, l) = \sqrt{\frac{1}{1 + \text{nf}(k, l)}} \qquad \text{eq. 4}$$

where k indicates the frequency line, l the time index for each sub-band sample, sfb_nrg(k,l) is the envelope representation, and nf(k,l) is the noise-floor level. When noise is generated with energy noiseLevel(k,l) and the highband amplitude is adjusted with adjustFactor(k,l) the added noise-floor and highband will have energy in accordance with sfb_nrg(k,l). An example of the output from the algorithm is displayed in FIGS. 3-5. FIG. 3 shows the spectrum of an original signal containing a very pronounced formant structure in the low band, but much less pronounced in the highband. Processing this with SBR without Adaptive Noise-floor Addition yields a result according to FIG. 4. Here it is evident that although the formant structure of the replicated highband is correct, the noise-floor level is too low. The noise-floor level estimated and applied according to the invention yields the result of FIG. 5, where the noise-floor superimposed on the replicated highband is displayed. The benefit of Adaptive Noise-floor Addition is here very obvious both visually and audibly.

Transposer Gain Adaptation

An ideal replication process, utilising multiple transposition factors, produces a large number of harmonic components, providing a harmonic density similar to that of the original. A method to select appropriate amplification-factors for the different harmonics is described below. Assume that the input signal is a harmonic series:

$$x(t) = \sum_{i=0}^{N-1} a_i \cos(2\pi f_i t). \quad \text{eq. 5}$$

A transposition by a factor two yields:

$$y(t) = \sum_{i=0}^{N-1} a_i \cos(2 \times 2\pi f_i t). \quad \text{eq. 6}$$

Clearly, every second harmonic in the transposed signal is missing. In order to increase the harmonic density, harmonics from higher order transpositions, M=3,5 etc, are added to the highband. To benefit the most of multiple harmonics, it is important to appropriately adjust their levels to avoid one harmonic dominating over another within an overlapping frequency range. A problem that arises when doing so, is how to handle the differences in signal level between the source ranges of the harmonics. These differences also tend to vary between programme material, which makes it difficult to use constant gain factors for the different harmonics. A method for level adjustment of the harmonics that takes the spectral distribution in the low band into account is here explained. The outputs from the transposers are fed through gain adjusters, added and sent to the envelope-adjustment filterbank. Also sent to this filterbank is the low band signal enabling spectral analysis of the same. In the present invention the signal-powers of the source ranges corresponding to the different transposition factors are assessed and the gains of the harmonics are adjusted accordingly. A more elaborate solution is to estimate the slope of the low band spectrum and compensate for this prior to the filterbank, using simple filter implementations, e.g. shelving filters. It is important to note that this procedure does not affect the equalisation functionality of the filterbank, and that the low band analysed by the filterbank is not re-synthesised by the same.

Noise Substitution Limiting

According to the above (eq. 5 and eq. 6), the replicated highband will occasionally contain holes in the spectrum. The envelope adjustment algorithm strives to make the spectral envelope of the regenerated highband similar to that of the original. Suppose the original signal has a high energy within a frequency band, and that the transposed signal displays a spectral hole within this frequency band. This implies, provided the amplification factors are allowed to assume arbitrary values, that a very high amplification factor will be applied to this frequency band, and noise or other unwanted signal components will be adjusted to the same energy as that of the original. This is referred to as unwanted noise substitution. Let $$P_1=[p_{11}, \ldots, p_{1N}] \quad \text{eq. 7}$$

be the scale factors of the original signal at a given time, and $$P_2=[p_{21}, \ldots, p_{2N}] \quad \text{eq. 8}$$

the corresponding scale factors of the transposed signal, where every element of the two vectors represents sub-band energy normalised in time and frequency. The required amplification factors for the spectral envelope adjustment filterbank is obtained as $$G = [g_1, \ldots, g_N] = \left[\sqrt{\frac{p_{11}}{p_{21}}}, \ldots, \sqrt{\frac{p_{1N}}{p_{2N}}}\right]. \quad \text{eq. 9}$$

By observing G it is trivial to determine the frequency bands with unwanted noise substitution, since these exhibit much higher amplification factors than the others. The unwanted noise substitution is thus easily avoided by applying a limiter to the amplification factors, i.e. allowing them to vary freely up to a certain limit, $g_{max}$. The amplification factors using the noise-limiter is obtained by $$G_{lim}=[\min(g_1,g_{max}), \ldots, \min(g_N,g_{max})] \quad \text{eq. 10}$$

However, this expression only displays the basic principle of the noise-limiters. Since the spectral envelope of the transposed and the original signal might differ significantly in both level and slope, it is not feasible to use constant values for $g_{max}$. Instead, the average gain, defined as $$G_{avg} = \sqrt{\frac{\sum_i P_{1i}}{\sum_i P_{2i}}}, \quad \text{eq. 11}$$

is calculated and the amplification factors are allowed to exceed that by a certain amount. In order to take wide-band level variations into account, it is also possible to divide the two vectors $P_1$ and $P_2$ into different sub-vectors, and process them accordingly. In this manner, a very efficient noise limiter is obtained, without interfering with, or confining, the functionality of the level-adjustment of the sub-band signals containing useful information.

Interpolation

It is common in sub-band audio coders to group the channels of the analysis filterbank, when generating scale factors. The scale factors represent an estimate of the spectral density within the frequency band containing the grouped analysis filterbank channels. In order to obtain the lowest possible bit rate it is desirable to minimise the number of scale factors transmitted, which implies the usage of as large groups of filter channels as possible. Usually this is done by grouping the frequency bands according to a Bark-scale, thus exploiting the logarithmic frequency resolution of the human auditory system. It is possible in an SBR-decoder envelope adjustment filterbank, to group the channels identically to the grouping used during the scale factor calculation in the encoder. However, the adjustment filterbank can still operate on a filterbank channel basis, by interpolating values from the received scale factors. The simplest interpolation method is to assign every filterbank channel within the group used for the scale factor calculation, the value of the scale factor. The transposed signal is also analysed and a scale factor per filterbank channel is calculated. These scale factors and the interpolated ones, representing the original spectral envelope, are used to calculate the amplification factors according to the above. There are two major advantages with this frequency domain interpolation scheme. The transposed signal usually has a sparser spectrum than the original. A spectral smoothing is thus beneficial and such is made more efficient when it operates on narrow frequency bands, compared to wide bands. In other words, the generated harmonics can be better isolated and controlled by the envelope adjustment filterbank. Furthermore, the performance of the noise limiter is improved since spectral holes can be better estimated and controlled with higher frequency resolution.

Smoothing

Figure 6:
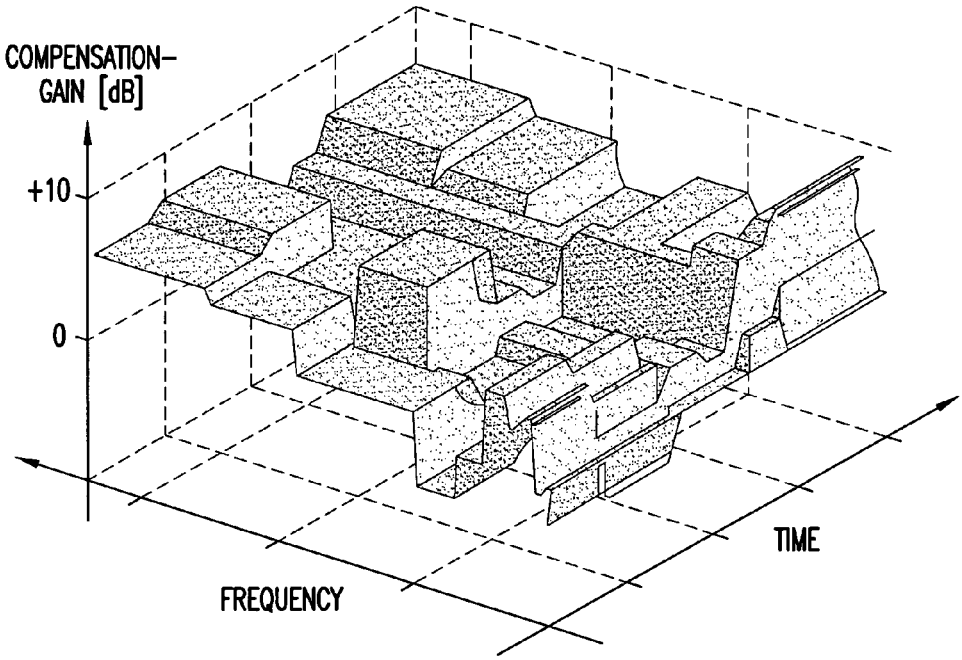
FIG. 6 illustrates the amplification factors for the spectral envelope adjustment filterbank, according to the present invention.
Figure 7:
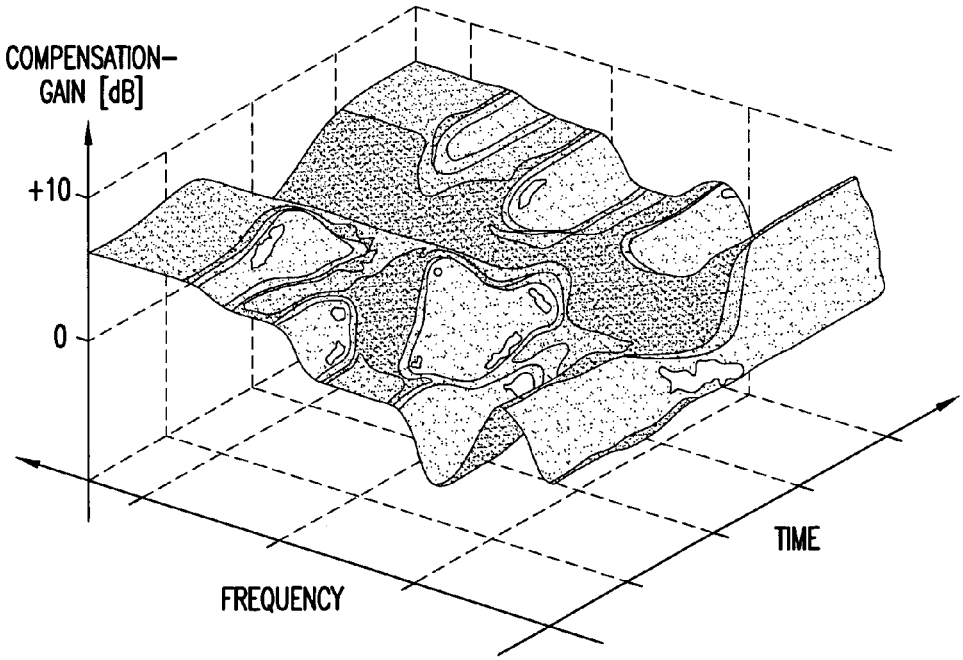
FIG. 7 illustrates the smoothing of amplification factors in the spectral envelope adjustment filterbank, according to the present invention.

It is advantageous, after obtaining the appropriate amplification factors, to apply smoothing in time and frequency, in order to avoid aliasing and ringing in the adjusting filterbank as well as ripple in the amplification factors. FIG. 6 displays the amplification factors to be multiplied with the corresponding subband samples. The figure displays two high-resolution blocks followed by three low-resolution blocks and one high resolution block. It also shows the decreasing frequency resolution at higher frequencies. The sharpness of FIG. 6 is eliminated in FIG. 7 by filtering of the amplification factors in both time and frequency, for example by employing a weighted moving average. It is important however, to maintain the transient structure for the short blocks in time in order not to reduce the transient response of the replicated frequency range. Similarly, it is important not to filter the amplification factors for the high-resolution blocks excessively in order to maintain the formant structure of the replicated frequency range. In FIG. 9b the filtering is intentionally exaggerated for better visibility.

Practical Implementations

Figure 8:
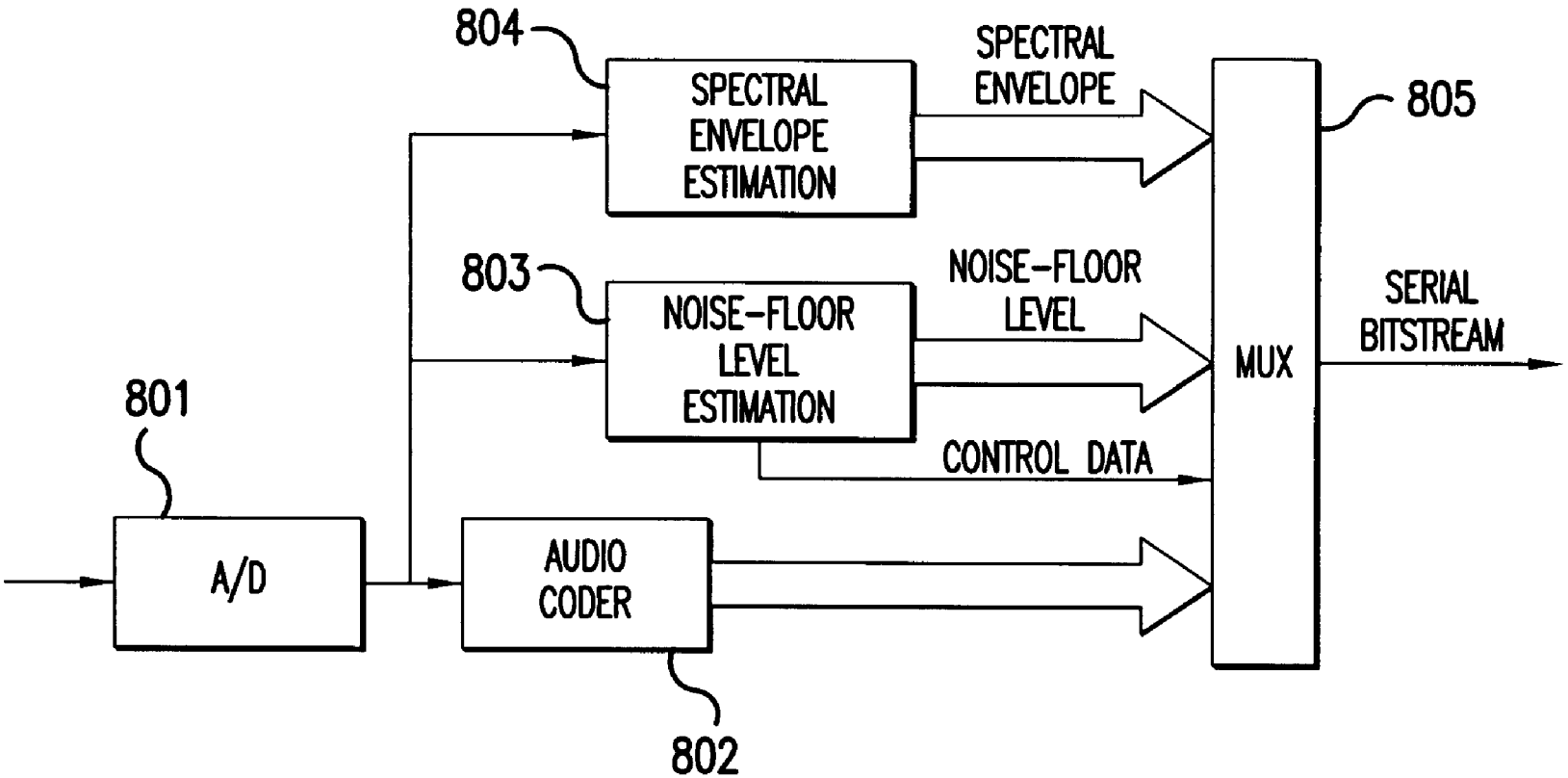
FIG. 8 illustrates a possible implementation of the present invention, in a source coding system on the encoder side.
Figure 9:
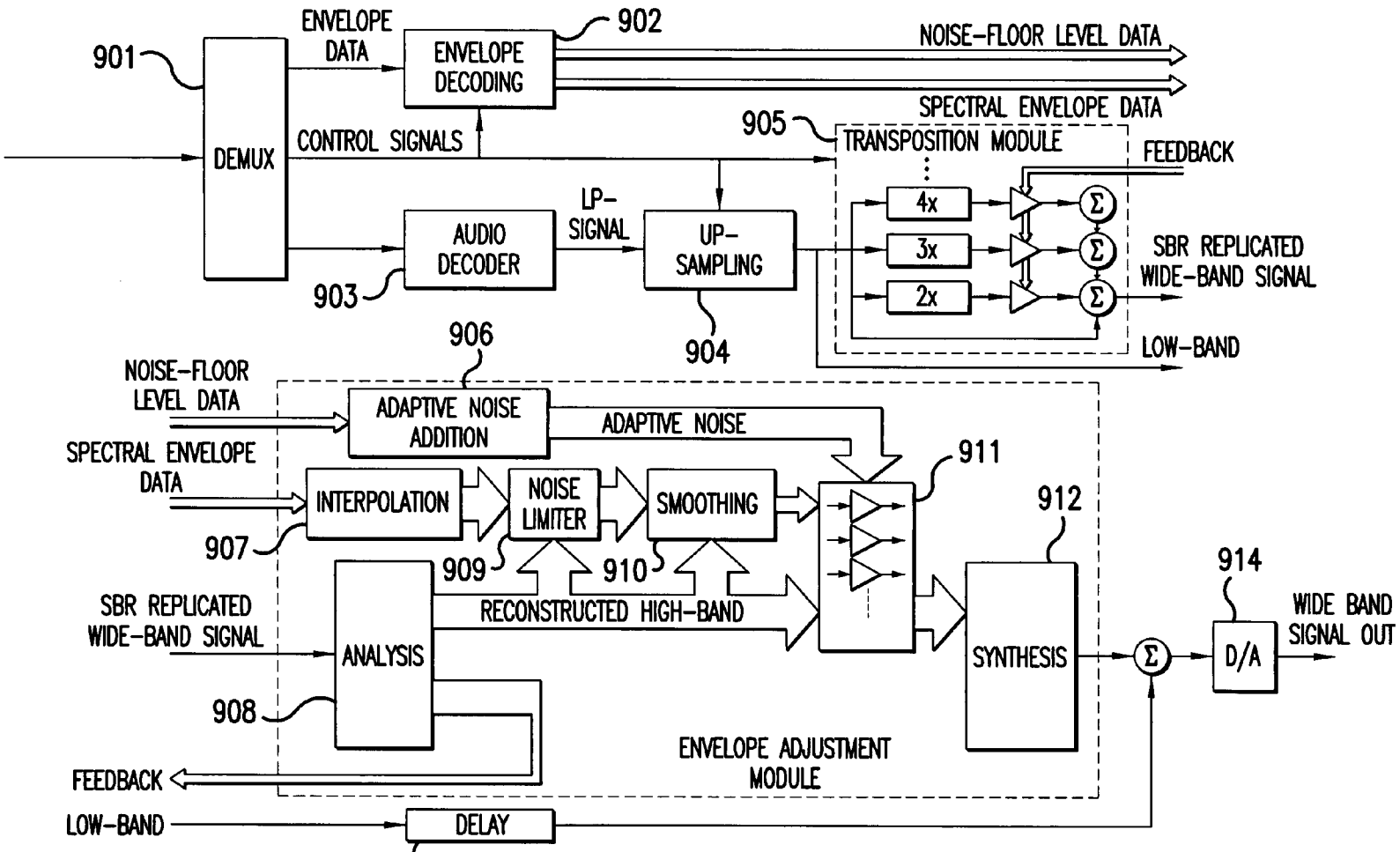
FIG. 9 illustrates a possible implementation of the present invention, in a source coding system on the decoder side.

The present invention can be implemented in both hardware chips and DSPs, for various kinds of systems, for storage or transmission of signals, analogue or digital, using arbitrary codecs. FIG. 8 and FIG. 9 shows a possible implementation of the present invention. Here the high-band reconstruction is done by means of Spectral Band Replication, SBR. In FIG. 8 the encoder side is displayed. The analogue input signal is fed to the A/D converter 801, and to an arbitrary audio coder, 802, as well as the noise-floor level estimation unit 803, and an envelope extraction unit 804. The coded information is multiplexed into a serial bitstream, 805, and transmitted or stored. In FIG. 9a typical decoder implementation is displayed. The serial bitstream is de-multiplexed, 901, and the envelope data is decoded, 902, i.e. the spectral envelope of the high-band and the noise-floor level. The demultiplexed source coded signal is decoded using an arbitrary audio decoder, 903, and up-sampled 904. In the present implementation SBR-transposition is applied in unit 905. In this unit the different harmonics are amplified using the feedback information from the analysis filterbank, 908, according to the present invention. The noise-floor level data is sent to the Adaptive Noise-floor Addition unit, 906, where a noise-floor is generated. The spectral envelope data is interpolated, 907, the amplification factors are limited 909, and smoothed 910, according to the present invention. The reconstructed high-band is adjusted 911 and the adaptive noise is added. Finally, the signal is re-synthesised 912 and added to the delayed 913 low-band. The digital output is converted back to an analogue waveform 914.

What is claimed is:

1. A method for enhancing a source encoding method, the source encoding method generating an encoded signal by encoding an original signal, the original signal having a low band portion and a high band portion, the encoded signal including the low band portion of the original signal and not including the high band portion of the original signal, comprising the following steps:

estimating a noise-floor level of the high band portion of the original signal, the noise floor level being a measure for a difference between a first spectral envelope determined by local minimum points of a spectral representation of the original signal and a second spectral envelope determined by local maximum points of a spectral representation of the original signal; and multiplexing the encoded signal including the low band portion of the original signal and the noise-floor level of the high band portion of the original signal to obtain an encoder output signal.

2. A method according to claim 1, in which the step of estimating includes the following step:

mapping the noise-floor level to several frequency bands to obtain a noise-floor level for each of the several frequency bands.

3. A method according to claim 2, in which the difference measure is additionally smoothed in time.

4. A method according to claim 2, further comprising the following steps:

providing an additional fine structured spectral representation of the original signal using a resolution which is lower than a resolution used in the step of providing the fine structured spectral representation;

performing the steps of applying a dip following action, applying a peak following action and forming a difference to obtain an additional difference measure; and choosing between the additional difference measure and the noise-floor level values to obtain a largest noise-floor level estimate.

5. A method according to claim 1, in which the noise-floor level is represented using linear predictive coding, or any other polynomial representation.

6. A method according to claim 1, in which the step of estimating includes the following steps:

providing a fine structured spectral representation of the original signal using a resolution which is sufficient so that formants or single sinusoidals in the spectral representation are visible, the fine structured spectral representation having local minimum points and local maximum points;

applying a dip-following action on the fine structured spectral representation for interpolating along the local minimum points to obtain the first spectral envelope;

applying a peak following action on the fine structured spectral representation of the original signal for interpolating along the maximum points to obtain the second spectral envelope;

forming a difference between the first spectral envelope and the second spectral envelope to obtain a difference measure; and smoothing the difference measure to obtain noise-floor level values.

7. A method according to claim 1, in which a spectral envelope of the high band portion of the original signal is estimated and additionally multiplexed into the encoder output signal to be used by a decoding method using a high-frequency reconstruction technique.

8. An apparatus for enhancing a source encoder, the source encoder generating an encoded signal by encoding an original signal, the original signal having a low band portion and a high band portion, the encoded signal including the low band portion of the original signal and not including the high band portion of the original signal, comprising:

an estimator for estimating a noise-floor level of the original signal, the noise floor level being a measure for a difference between a first spectral envelope determined by local minimum points of a spectral representation of the original signal and a second spectral envelope determined by local maximum points of a spectral representation of the original signal; and a multiplexer for multiplexing the encoded signal including the low band portion of the original signal and the noise-floor level of the high band portion of the original signal to obtain an encoder output signal.

9. An apparatus for enhancing a source decoder, the source decoder generating a decoded signal by decoding an encoded signal obtained by source encoding of an original signal, the original signal having a low band portion and a high band portion, the encoded signal including the low band portion of the original signal and not including the high band portion of the original signal, wherein the decoded signal is used for high-frequency reconstruction to obtain a high-frequency reconstructed signal including a reconstructed high band portion of the original signal, comprising:

a demultiplexer for demultiplexing an input signal including the encoded signal and a noise-floor level of the high band portion of the original signal, the noise floor level being a measure for a difference between a first spectral envelope determined by local minimum points of a spectral representation of the original signal and a second spectral envelope determined by local maximum points of a spectral representation of the original signal;

means for obtaining a spectral envelope representation of the high band portion of the original signal;

a shaper for shaping a spectrum of a random noise signal in accordance to the spectral envelope representation of the high band portion of the original signal to obtain a spectrally shaped random noise signal;

an adjuster for adjusting the spectrally shaped random noise signal in accordance to the noise-floor level to obtain an adjusted spectrally shaped random noise signal; and an adder for adding the adjusted spectrally shaped random noise signal to the high-frequency reconstructed signal to obtain an enhanced high-frequency reconstructed signal.

10. An apparatus according to claim 9, further comprising:

a combiner for combining the enhanced high-frequency reconstructed signal and the decoded signal to generate an output signal having the low band portion of the original signal and a reconstructed high band portion of the original signal.

11. A method for enhancing a source decoding method, the source decoding method generating a decoded signal by decoding an encoded signal obtained by source encoding of an original signal, the original signal having a low band portion and a high band portion, the encoded signal including the low band portion of the original signal and not including the high band portion of the original signal, wherein the decoded signal is used for high-frequency reconstruction to obtain a high-frequency reconstructed signal including a reconstructed high band portion of the original signal, comprising the following steps:

demultiplexing an input signal including the encoded signal and a noise-floor level of the high band portion of the original signal, the noise floor level being a measure for a difference between a first spectral envelope determined by local minimum points of a spectral representation of the original signal and a second spectral envelope determined by local maximum points of a spectral representation of the original signal;

obtaining a spectral envelope representation of the high band portion of the original signal;

shaping a spectrum of a random noise signal in accordance to the spectral envelope representation of the high band portion of the original signal to obtain a spectrally shaped random noise signal;

adjusting the spectrally shaped random noise signal in accordance to the noise-floor level to obtain an adjusted spectrally shaped random noise signal; and adding the adjusted spectrally shaped random noise signal to the high-frequency reconstructed signal to obtain an enhanced high-frequency reconstructed signal.

12. The method in according to claim 11, in which the spectral envelope representation includes an energy measure for an energy of the high-frequency reconstructed signal and the noise-floor, the method further comprising the following step:

adjusting the high-frequency reconstructed signal so that a combined energy of the high-frequency reconstructed signal and the adjusted spectrally shaped random noise signal corresponds to the energy measure of the spectral envelope representation.

13. The method according to claim 11, in which the step of adjusting the spectrally shaped random noise signal includes a step of smoothing a level of the spectrally shaped random noise signal in time and/or frequency.

14. The method according to claim 11, in which a spectral envelope of the high-frequency reconstructed signal is adjusted using interpolation.

15. The method according to claim 11, in which a spectral envelope of the high-frequency reconstructed signal is adjusted using smoothing of envelope adjustment amplification factors.

16. An apparatus for enhancing a source decoder, the source decoder generating a decoded signal by decoding an encoded signal obtained by source encoding of an original signal, the original signal having a low band portion and a high band portion, the encoded signal including the low band portion of the original signal and not including the high band portion of the original signal, wherein the decoded signal is used for high-frequency reconstruction to obtain a high-frequency reconstructed signal including a reconstructed high band portion of the original signal, comprising:

an adjuster for adjusting a spectral envelope of the high-frequency reconstructed signal, the adjuster including a limiter for limiting of envelope adjustment amplification factors.

17. An apparatus for enhancing a source decoder, the source decoder generating a decoded signal by decoding an encoded signal obtained by source encoding of an original signal, the original signal having a low band portion and a high band portion, the encoded signal including the low band portion of the original signal and not including the high band portion of the original signal, wherein the decoded signal is used for high-frequency reconstruction to obtain a high-frequency reconstructed signal including a reconstructed high band portion of the original signal, comprising:

a high frequency reconstruction module for generating a signal, the high-frequency reconstruction module having a summer for summing several high-frequency reconstructed signals, originating from different low band frequency ranges of the decoded signal to obtain the signal, and an analyzer for analyzing the low band portion of the decoded signal and for providing control data to the summer.

*18. Encoder comprising:*

*an audio coder for encoding an audio signal to obtain an encoded signal, the encoded signal including the low band portion of the original signal and not including the high band portion of the original signal, comprising:*

*a noise estimation device for estimating a level of noise to be added in a high-frequency regeneration process at a decoder; and*

*an envelope extraction unit for extracting a spectral envelope of the original signal to be used for adjusting a reconstructed high-band portion of the original signal.*

*19. Encoder in accordance with claim 18, in which the noise level is determined such that noise to be added to the reconstructed high-band results in a noise contents in the reconstructed high-band, which is similar to the noise content in the high-band of the original signal.*

*20. Encoder in accordance with claim 18, in which the noise estimator is operated to perform an analysis by synthesis approach for determining the noise level.*

*21. Encoder in accordance with claim 18, in which the noise estimator includes a decoder and is operative to assess a correct value of the amount of adaptive noise required.*

*22. Encoding method comprising:*

*encoding an audio signal to obtain an encoded signal, the encoded signal including the low band portion of the original signal and not including the high band portion of the original signal, comprising:*

*estimating a level of noise to be added in a high-frequency regeneration process at a decoder; and*

*extracting a spectral envelope of the original signal to be used for adjusting a reconstructed high-band portion of the original signal.*

* * * * *